US010366776B2

(12) United States Patent
Oh et al.

(10) Patent No.: US 10,366,776 B2
(45) Date of Patent: Jul. 30, 2019

(54) MEMORY SYSTEM FOR EFFECTIVELY ORGANIZING SUPER MEMORY BLOCK AND OPERATING METHOD THEREOF

(71) Applicant: SK hynix Inc., Gyeonggi-do (KR)

(72) Inventors: Ik-Sung Oh, Gyeonggi-do (KR); Byeong-Gyu Park, Gyeonggi-do (KR); Kyu-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 9 days.

(21) Appl. No.: 15/695,279

(22) Filed: Sep. 5, 2017

(65) Prior Publication Data

US 2018/0151251 A1 May 31, 2018

(30) Foreign Application Priority Data

Nov. 29, 2016 (KR) ........................ 10-2016-0160093

(51) Int. Cl.

| | |
|---|---|
| ***G11C 29/00*** | (2006.01) |
| ***G06F 3/06*** | (2006.01) |
| ***G11C 29/42*** | (2006.01) |
| ***G11C 29/44*** | (2006.01) |

(52) U.S. Cl.

CPC .............. *G11C 29/82* (2013.01); *G06F 3/064* (2013.01); *G06F 3/0619* (2013.01); *G11C 29/42* (2013.01); *G11C 29/4401* (2013.01); *G11C 29/76* (2013.01)

(58) Field of Classification Search

CPC ......... G11C 29/52; G11C 29/08; G11C 29/82; G11C 29/4401; G11C 29/76; G11C 29/883; G11C 29/785; G11C 16/249; G11C 16/3495; G11C 16/0483; G11C 16/3459; G11C 5/04; G11C 7/24; G11C 11/5641; G06F 3/064; G06F 3/0619

USPC ......... 365/200, 201, 185.09, 185.11, 185.12, 365/185.23

See application file for complete search history.

(56) References Cited

U.S. PATENT DOCUMENTS

| | | | | |
|---|---|---|---|---|
| 8,832,507 B2 * | 9/2014 | Post | .................... | G06F 11/1048 714/718 |
| 9,123,422 B2 * | 9/2015 | Yu | .......................... | G11C 16/10 |
| 9,547,589 B2 * | 1/2017 | Yu | ........................ | G11C 16/349 |
| 9,671,962 B2 * | 6/2017 | Ellis | ......................... | G06F 3/064 |
| 2013/0145085 A1 * | 6/2013 | Yu | ....................... | G06F 12/0246 711/103 |
| 2016/0179591 A1 * | 6/2016 | Arimilli | .................. | G06F 9/546 710/316 |

FOREIGN PATENT DOCUMENTS

| | | |
|---|---|---|
| KR | 1020120098068 | 9/2012 |
| KR | 1020150107197 | 9/2015 |

* cited by examiner

*Primary Examiner* — Gene N Auduong
(74) *Attorney, Agent, or Firm* — IP & T Group LLP

(57) ABSTRACT

A memory system may include: a memory device including a plurality of memory blocks configured in a plurality of super memory blocks; and a controller suitable for detecting two or more bad super memory blocks each including at least one bad block among the super memory blocks, selecting at least one victim super memory block among the bad super memory blocks, and replacing the at least one bad block in each remaining bad super memory block with at least one normal block of the victim super memory block.

20 Claims, 15 Drawing Sheets

FIG. 8B

| VICTIM SUPER BLOCK | DIE 0 | | | | DIE 1 | | | | . . . | DIE 7 |
|---|---|---|---|---|---|---|---|---|---|---|
| | PLANE 0 | PLANE 1 | PLANE 2 | PLANE 3 | PLANE 0 | PLANE 1 | PLANE 2 | PLANE 3 | . . . | PLANE 3 |
| 145 | FFFF | 166 | 180 | 180 | FFFF | | | | | 501 |
| 504 | | | | | | | | | | 463 |
| 607 | | | | | | | | | | |
| .<br>.<br>. | | | | | | | | | | |
| 906 | | | | | | | | | | |
| 912 | | | | | | | | | | |

FIG. 10B

| VICTIM SUPER BLOCK | DIE 0 | | | | | | | | DIE 1 | | | | | | | | ... | DIE 7 | |
|---|---|---|---|---|---|---|---|---|---|---|---|---|---|---|---|---|---|---|---|
| | PLANE 0 | | PLANE 1 | | PLANE 2 | | PLANE 3 | | PLANE 0 | | PLANE 1 | | PLANE 2 | | PLANE 3 | | ... | PLANE 3 | |
| 145 | FFFF | VOID | 180 | END | 191 | END | 200 | S3D1P0 | FFFF | VOID | | | | | | | | 501 | FFFF |
| 504 | | | | | | | | | | | | | | | | | | 463 | FFFF |
| 607 | | | | | | | | | 200 | END | | | | | | | | | |
| ⋮ | | | | | | | | | | | | | | | | | | | |
| 906 | | | | | | | | | | | | | | | | | | | |
| 912 | | | | | | | | | | | | | | | | | | | |

MEMORY SYSTEM FOR EFFECTIVELY ORGANIZING SUPER MEMORY BLOCK AND OPERATING METHOD THEREOF

CROSS-REFERENCE TO RELATED APPLICATION

This application claims priority under 35 U.S.C. § 119 to Korean Patent Application No. 10-2016-0160093 filed on Nov. 29, 2016 in the Korean Intellectual Property Office, the disclosure of which is incorporated herein by reference in its entirety.

TECHNICAL FIELD

Exemplary embodiments relate to a memory system including a memory device and an operating method thereof.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main memory or an auxiliary memory of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

In a memory system, a memory device may be configured by a plurality of blocks, some of which may be or become bad blocks. Typically, a memory system may swap a bad block with a normal block, to provide access to the normal block in response to a request of access to the bad block. However, an excessively large storage space is required for storing mapping information relating to the swapping of bad blocks and normal blocks in a memory system.

SUMMARY

Various embodiments of the present invention are directed to a memory system exhibiting a substantially improved efficiency in the use of a memory device, and an operating method thereof.

In an embodiment, a memory system may include: a memory device including a plurality of memory blocks configured in a plurality of super memory blocks; and a controller suitable for detecting two or more bad super memory blocks each including at least one bad block among the super memory blocks, selecting at least one victim super memory block among the bad super memory blocks, and replacing the at least one bad block in each remaining bad super memory block with at least one normal block of the victim super memory block.

The controller may generate a bad group table indicating a mapping relationship between the at least one bad block of each of the remaining bad super memory blocks and the corresponding normal blocks of the at least one victim super memory block which replace the at least one bad block of each of the remaining bad super memory blocks.

In response to a request of access to at least one of the two or more bad super memory blocks, the controller may provide access to the normal blocks replacing the bad blocks in the access-requested bad super memory blocks according to the mapping relationship.

The controller may replace the bad blocks with the normal blocks having the same physical locations as the bad blocks in the bad super memory blocks, and the physical location may be of a plane level in the memory device.

The bad group table may include at least one entry respectively representing the at least one victim super memory block, for the at least one entry, the bad group table may include a plurality of location fields respectively representing physical locations of memory blocks of a corresponding victim super memory block, and each location field representing the normal block in the at least one victim super memory block may have been an address value of the bad super memory block having the bad block, which is replaced by the normal block represented thereby.

The bad group table may include at least one row and a plurality of columns configured in the form of a matrix, and the at least one victim super memory block may correspond to one row, memory blocks included in the at least one victim super memory block may correspond to the columns, and the bad blocks included in the bad super memory blocks may be mapped to the columns.

In response to the request, the controller may provide access to the normal blocks replacing the bad blocks in the access-requested bad super memory blocks by: searching the address values of the access-requested bad super memory block on an entry-by-entry basis in the bad group table; and identifying the normal blocks replacing the access-requested bad blocks through the physical locations of the normal blocks indicated by the location fields having the address values of the access-requested bad super memory blocks.

The bad group table may include at least one entry representing the at least one victim super memory block, for the at least one entry, the bad group table may include a plurality of location fields respectively representing physical locations of memory blocks of the at least one victim super memory block and each location field including first and second sub-fields, the first sub-field, a corresponding location field of which represents the normal block in the at least one victim super memory block, may have been an address value of the bad super memory block having the bad block, which is replaced by the normal block represented by the corresponding location field, and the second sub-field of the corresponding location field may have been a pointer information indicating another normal block in another victim super memory block replacing another bad block in the bad super memory block represented by the corresponding location field.

In response to a request of access to at least one of the bad super memory blocks, the controller may provide the normal blocks replacing the bad blocks in the access-requested bad super memory blocks by: searching the address value of the access-requested bad super memory block on an entry-by-entry basis in the bad group table; identifying a first normal block replacing a first one of the bad blocks in the respective access-requested bad super memory blocks through the physical location of the first normal block indicated by the location field having the address value of the respective access-requested bad super memory blocks in the first sub-field thereof; and identifying respective second and following normal blocks replacing respective second and following ones of the bad blocks in the respective access-requested bad super memory blocks through the physical locations of the respective second and following normal blocks indicated by the location fields corresponding to the respective second and following normal blocks and having the address value of the respective access-requested bad super memory blocks in the first sub-fields of the location fields corresponding to the respective second and following normal blocks via the pointer information in the second sub-fields of the location fields corresponding to the respective first and following normal blocks.

In an embodiment, a method for operating a memory system which includes a memory device including a plurality of super memory blocks each having a plurality of memory blocks, the method may include: detecting two or more bad super memory blocks each including at least one bad block among the super memory blocks; selecting at least one victim super memory block among the bad super memory blocks; and replacing the bad blocks in each remaining bad super memory block with normal blocks of the victim super memory block, the replacing may include generating a bad group table indicating a mapping relationship between the bad blocks of the remaining bad super memory blocks and the corresponding normal blocks, which replaces the respective bad blocks, of the at least one victim super memory block.

The replacing may include, in response to a request of access to one or more of the bad super memory blocks, providing access to the normal blocks replacing the bad blocks in the access-requested bad super memory blocks according to the mapping relationship.

The respective bad blocks may be replaced with the respective normal blocks having the same physical locations as the respective bad blocks in the respective bad super memory blocks, and the physical location may be of a plane level in the memory device.

The bad group table may include at least one entry respectively representing the at least one victim super memory block, the at least one entry including a plurality of location fields respectively representing physical locations of memory blocks of the at least one victim super memory block, each location field representing the normal block in the at least one victim super memory block having an address value of the bad super memory block having the bad block, which is replaced by the normal block represented thereby.

The bad group table may include at least one row and a plurality of columns configured in the form of a matrix, the at least one victim super memory block corresponds to one row, memory blocks included in the at least one victim super memory block correspond to the columns, and the bad blocks included in the bad super memory blocks are mapped to the columns.

The providing of access may include: searching the address values of the access-requested bad super memory blocks on an entry-by-entry basis in the bad group table; and identifying the normal blocks replacing the bad blocks in the access-requested bad super memory blocks through the physical locations of the normal blocks indicated by the location fields having the address values of the access-requested bad super memory blocks.

The bad group table may include at least one entry respectively representing the at least one victim super memory block, for the at least one entry, the bad group table may include a plurality of location fields respectively representing physical locations of memory blocks of the at least one victim super memory block and each including first and second sub-fields, the first sub-field, a corresponding location field of which represents the normal block in the at least one victim super memory block, may have been an address value of the bad super memory block having the bad block, which is replaced by the normal block represented by the corresponding location field, and the second sub-field of the corresponding location field may have been a pointer information indicating another normal block in another victim super memory block replacing another bad block in the bad super memory block represented by the corresponding location field.

The providing of access may include: searching the address value of the access-requested bad super memory blocks on an entry-by-entry basis in the bad group table; identifying a first normal block replacing a first one of the bad blocks in the respective access-requested bad super memory blocks through the physical location of the first normal block indicated by the location field having the address value of the respective access-requested bad super memory blocks in the first sub-field thereof; and identifying respective second and following normal blocks replacing respective second and following ones of the bad blocks in the respective access-requested bad super memory blocks through the physical locations of the respective second and following normal blocks indicated by the location fields corresponding to the respective second and following normal blocks and having the address value of the respective access-requested bad super memory blocks in the first sub-fields of the location fields corresponding to the respective second and following normal blocks via the pointer information in the second sub-fields of the location fields corresponding to the respective first and following normal blocks.

In an embodiment, a memory system may include: a memory device including a plurality of dies, each die comprising a plurality of planes and each plane comprising a plurality of memory blocks; a controller suitable for arranging the plurality of memory blocks in a plurality of super memory blocks, detecting two or more bad super memory blocks each including a bad block, selecting a victim super memory block among the bad super memory blocks, and generating a bad group table indicating a mapping relationship between the bad block of each of the remaining bad super memory blocks and the corresponding normal blocks of the victim super memory block for replacing the bad block of each of the remaining bad super memory blocks with the corresponding normal blocks of the victim super memory block.

In response to a request of access to a bad super memory block, the controller may provide access to the normal blocks replacing the bad blocks in the access-requested bad super memory blocks according to the mapping relationship.

The controller may replace the bad blocks with the normal blocks having the same physical locations as the bad blocks in the bad super memory blocks, and the physical location may be of a plane level in the memory device.

BRIEF DESCRIPTION OF THE DRAWINGS

These and other features and advantages of the present invention will become apparent to those skilled in the art to which the present invention pertains from the following detailed description in reference to the accompanying drawings, wherein:

FIGS. 8A and 8B are diagrams illustrating the operation of allocating a normal block of a victim super memory block in accordance with an embodiment.

FIGS. 10A and 10B are diagrams illustrating an operation of allocating a normal block of a victim super memory block in accordance with an embodiment.

DETAILED DESCRIPTION

Figure 1:
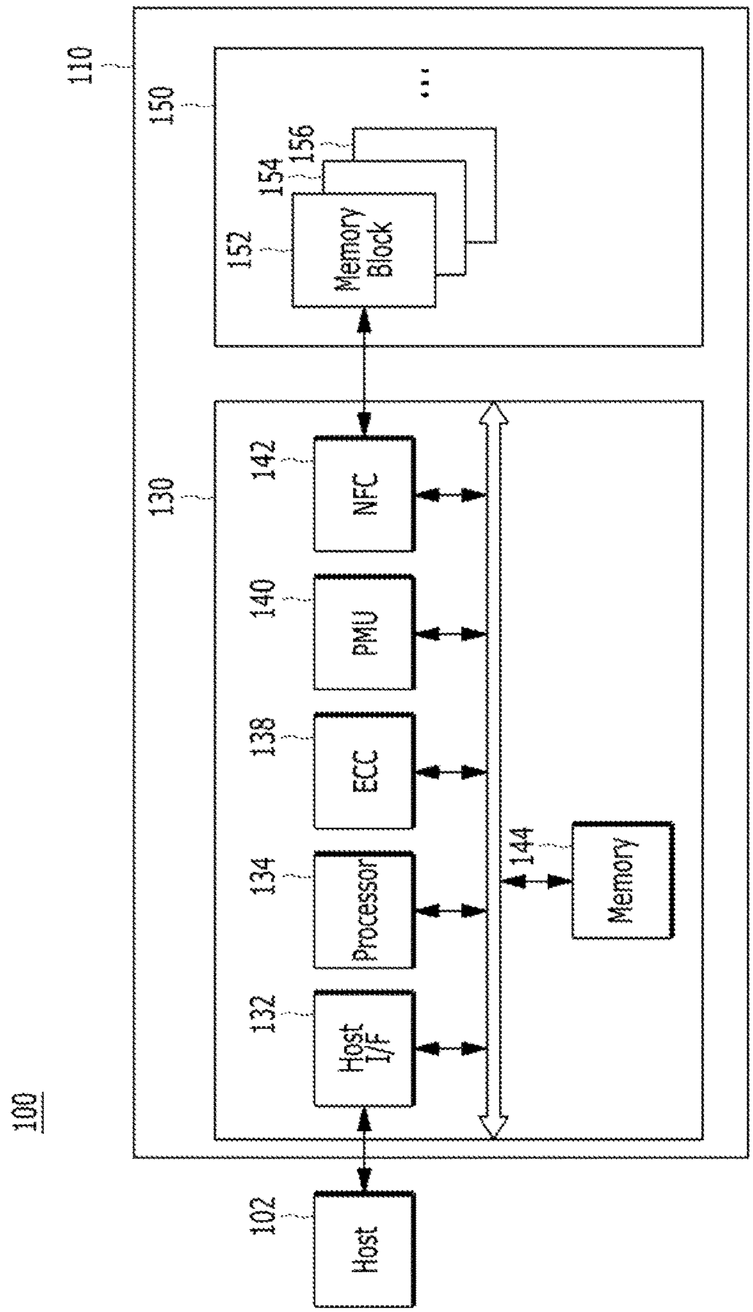
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of an embodiment, unless otherwise specifically indicated.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The host 102 may include at least one OS (operating system) for managing and controlling the overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix.

Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensioanl (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
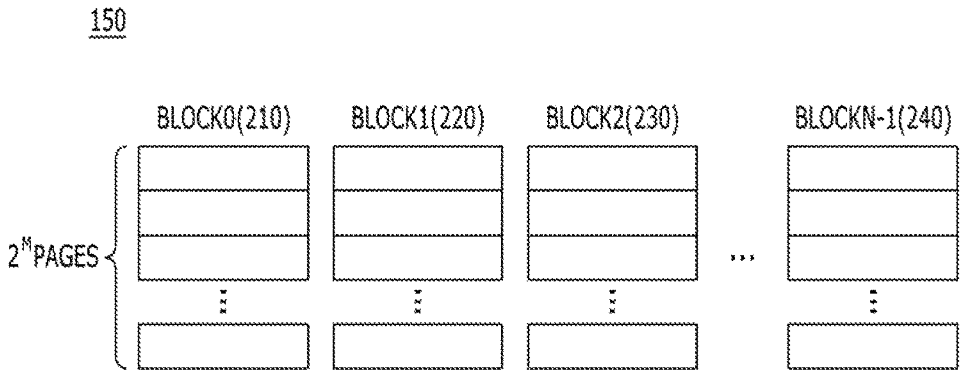
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, an MLC storing 3-bit data also referred to as a triple level cell (TLC), an MLC storing 4-bit level cell also referred to as a quadruple level cell (QLC), or an MLC storing 5-or-more-bit data.

Figure 3:
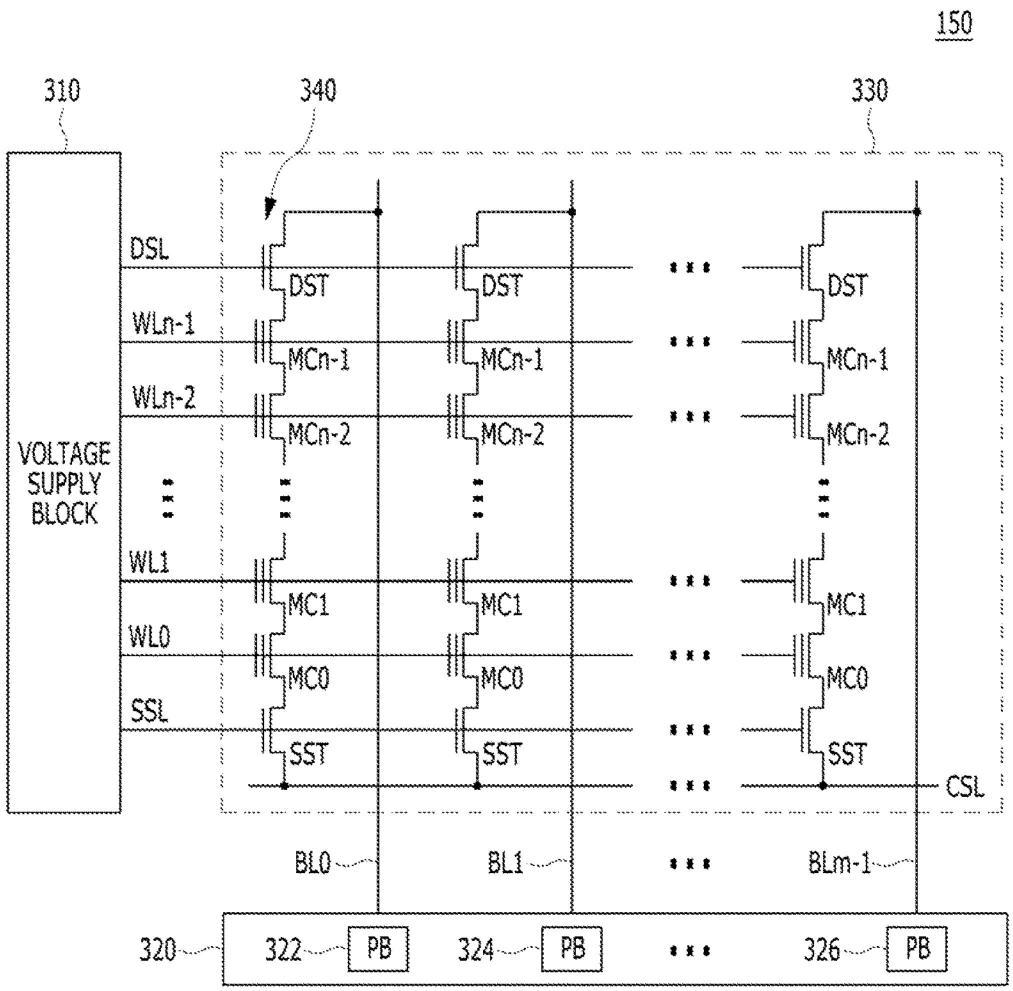
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
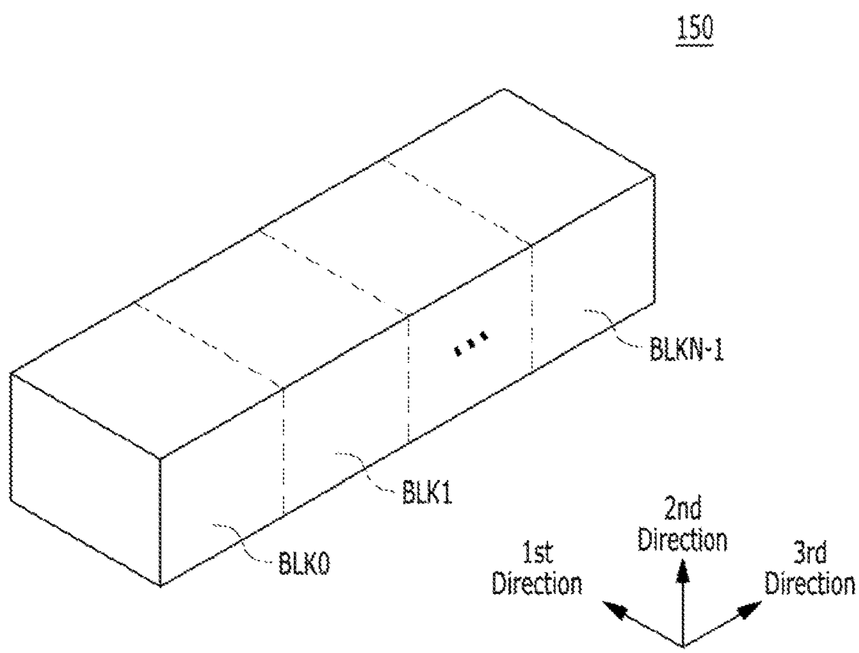
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5A:
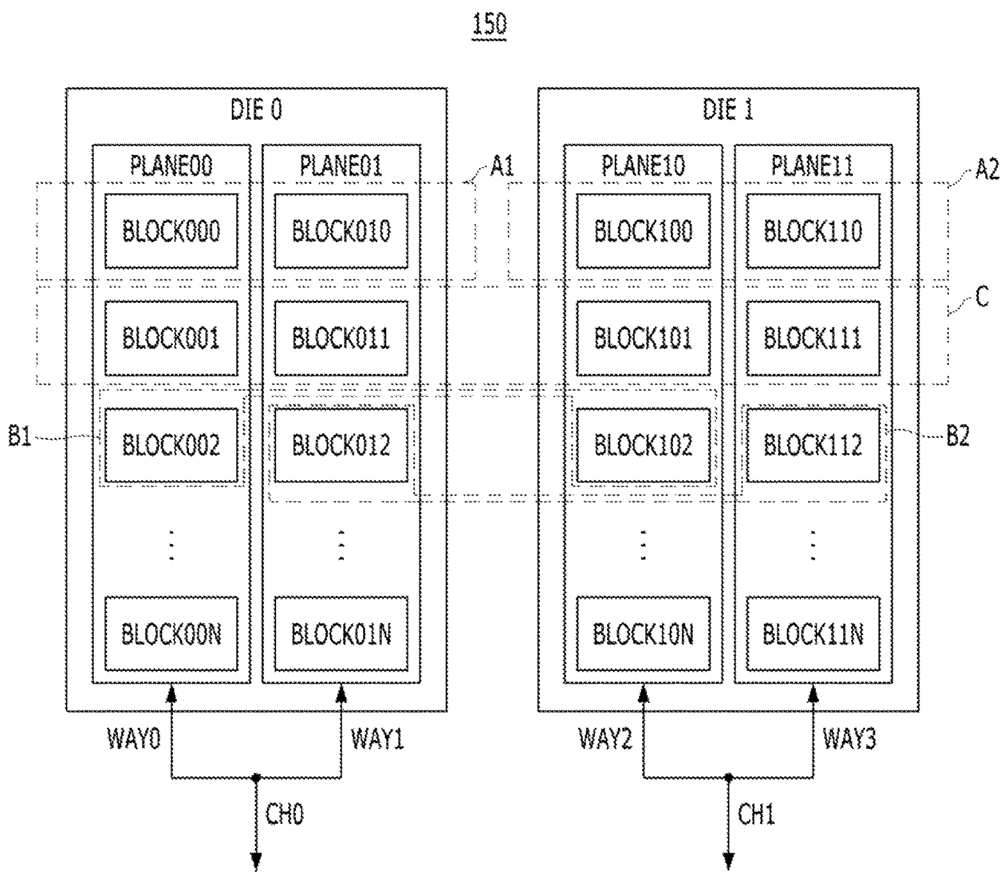
FIG. 5A is an exemplary diagram illustrating a super memory block.

FIG. 5A is an exemplary diagram illustrating a super memory block.

Referring to FIG. 5A, the memory device 150 includes a plurality of memory blocks BLOCK000 to BLOCK11N.

The memory device 150 includes a zeroth memory die DIE0 coupled to a zeroth channel CH0 and a first memory die DIE1 coupled to a first channel CH1. The zeroth channel CH0 and the first channel CH1 may input/output data in an interleaving scheme.

The zeroth memory die DIE0 includes a plurality of planes PLANE00 and PLANE01 respectively coupled to a plurality of ways WAY0 and WAY1 for transferring data in the interleaving scheme by sharing the zeroth channel CH0.

The first memory die DIE1 includes a plurality of planes PLANE10 and PLANE11 respectively coupled to a plurality of ways WAY2 and WAY3 transferring data in the interleaving scheme by sharing the first channel CH1.

The first plane PLANE00 of the zeroth memory die DIE0 includes a predetermined number of memory blocks BLOCK000 to BLOCK00N among the plurality of memory blocks BLOCK000 to BLOCK11N.

The second plane PLANE01 of the zeroth memory die DIE0 includes the predetermined number of memory blocks BLOCK010 to BLOCK01N among the plurality of memory blocks BLOCK000 to BLOCK11N.

The first plane PLANE10 of the first memory die DIE1 includes the predetermined number of memory blocks BLOCK100 to BLOCK10N among the plurality of memory blocks BLOCK000 to BLOCK11N.

The second plane PLANE11 of the first memory die DIE1 includes the predetermined number of memory blocks BLOCK110 to BLOCK11N among the plurality of memory blocks BLOCK000 to BLOCK11N.

In this manner, the plurality of memory blocks BLOCK000 to BLOCK11N included in the memory device 150 may be divided according to their physical locations for receiving and providing data through the same ways or the same channels.

FIG. 5A illustrates, as an example, two memory dies DIE0 and DIE1 included in the memory device 150, two planes included in each of the dies DIE0 and DIE1 and the same predetermined number of memory blocks included in each of planes. It is noted that, according to a designer's choice, the number of memory dies may be greater or smaller than two. Also, the number of planes may be greater or smaller than two and the number of memory blocks included in each plane may be adjusted variously according to a designer's choice.

Meanwhile, the controller 130 may manage a plurality of memory blocks by grouping the memory blocks into several super memory blocks, each of which the controller 130 may select simultaneously. For example, the controller 130 may use a scheme of dividing a plurality of memory blocks according to simultaneous selection and operation of memory blocks. For example, the controller 130 may manage a plurality of memory blocks which are divided into different dies or different planes through a dividing scheme according to physical positions, by grouping memory blocks capable of being selected simultaneously among the plurality of memory blocks and thereby dividing the plurality of memory blocks into super memory blocks.

The scheme of grouping, in this manner, the plurality of memory blocks into super memory blocks by the controller 130 may be modified according to a designer's choice. Three exemplary schemes will be exemplified herein.

According to a first example, a method for managing the memory blocks of the memory device 150 into super memory blocks may include to manage one super memory block A1 by grouping, by the controller 130, one optional memory block BLOCK000 in the first plane PLANE00 and one optional memory block BLOCK010 in the second plane PLANE01 of the zeroth memory die DIE0 between the plurality of memory dies DIE0 and DIE1 included in the memory device 150. When applying the first scheme to the first memory die DIE1 between the plurality of memory dies DIE0 and DIE1 included in the memory device 150, the controller 130 may manage one super memory block A2 by grouping one optional memory block BLOCK100 in the first plane PLANE10 and one optional memory block BLOCK110 in the second plane PLANE11 of the first memory die DIE1.

Another example, may include to manage one super memory block B1 by grouping, by the controller 130, one optional memory block BLOCK002 included in the first plane PLANE00 of the zeroth memory die DIE0 between the plurality of memory dies DIE0 and DIE1 included in the memory device 150 and one optional memory block BLOCK102 included in the first plane PLANE10 of the first memory die DIE1. When applying the second scheme again, the controller 130 may manage one super memory block B2 by grouping one optional memory block BLOCK012 included in the second plane PLANE01 of the zeroth memory die DIE0 between the plurality of memory dies DIE0 and DIE1 included in the memory device 150 and one optional memory block BLOCK112 included in the second plane PLANE11 of the first memory die DIE1.

A third example may include to manage one super memory block C by grouping, by the controller 130, one optional memory block BLOCK001 included in the first plane PLANE00 of the zeroth memory die DIE0 between the plurality of memory dies DIE0 and DIE1 included in the memory device 150, one optional memory block BLOCK011 included in the second plane PLANE01 of the zeroth memory die DIE0, one optional memory block BLOCK101 included in the first plane PLANE10 of the first memory die DIE1 and one optional memory block BLOCK111 included in the second plane PLANE11 of the first memory die DIE1.

In the respective super memory blocks, memory blocks may be simultaneously selected through an interleaving scheme, for example, a channel interleaving scheme, a memory die interleaving scheme, a memory chip interleaving scheme or a way interleaving scheme.

Figure 5B:
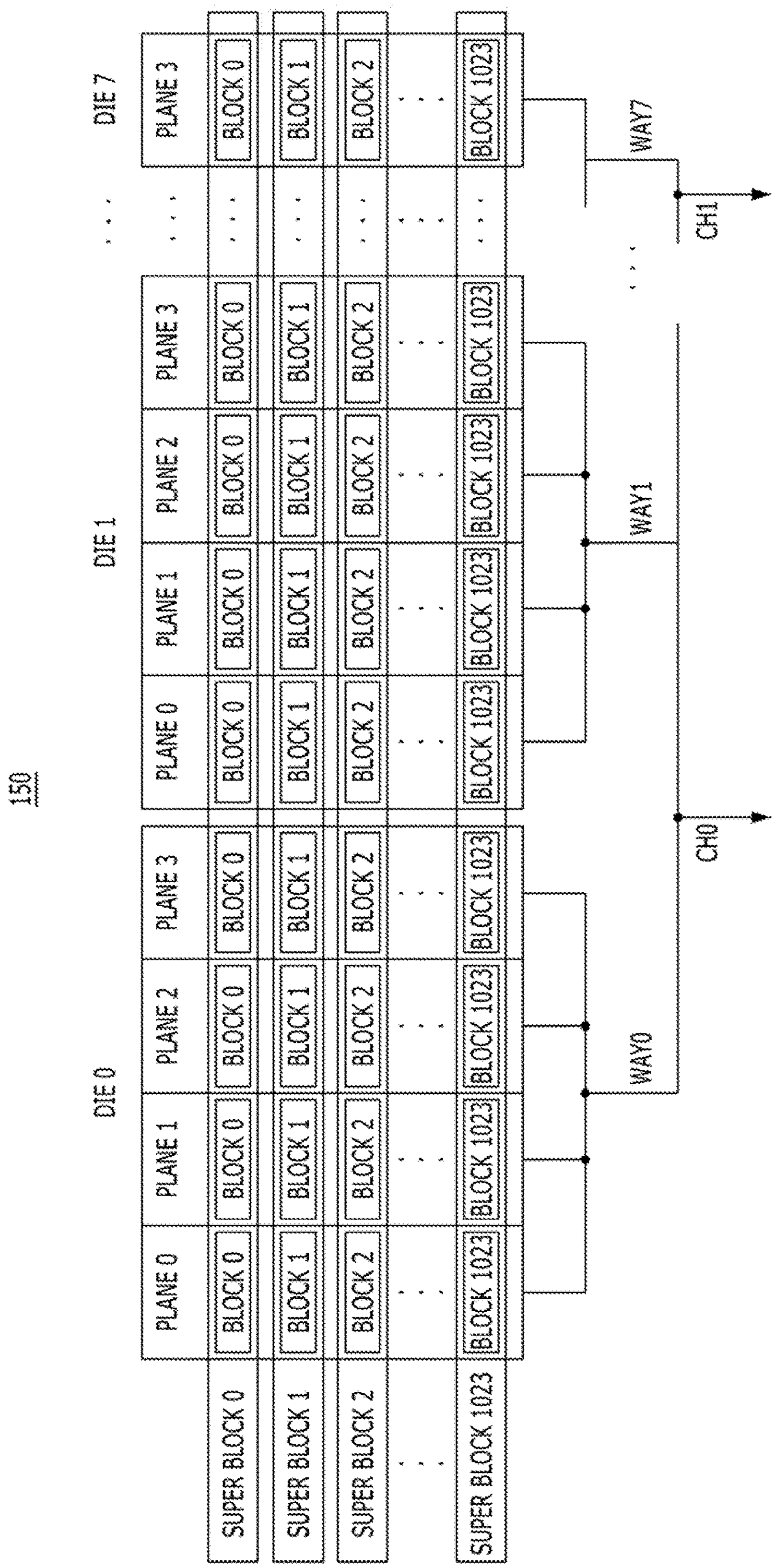
FIG. 5B is a diagram illustrating an operation of managing memory blocks in units of super memory blocks in the memory system in accordance with an embodiment of the present invention.

FIG. 5B is a diagram illustrating an operation of managing memory blocks in units of super memory blocks in the memory system in accordance with an embodiment of the present invention.

First, it is exemplified that the memory device 150 includes eight memory dies DIE<0:7>, each of the eight memory dies DIE<0:7> includes four planes PLANE<0:3> to allow the eight memory dies DIE<0:7> to include total 32 planes PLANE<0:3>*8, and each of the 32 planes PLANE<0:3>*8 includes 1,024 memory blocks BLOCK<0:1023>. In other words, it is exemplified that the memory device 150 includes total 32,768 memory blocks BLOCK<0:1023>*32.

Also, it is exemplified that, in the memory device 150, the total 32 planes PLANE<0:3>*8 included in the eight memory dies DIE<0:7> input/output data through two channels CH<0:1> and eight ways WAY<0:7>. Namely, it is exemplified that, in the memory device 150, four planes PLANE<0:3> of the respective 8 dies DIE<0:7> share one of 8 ways WAY<0:7>. Also, a first half of the 8 ways WAY<0:7> (e.g., first four ways WAY<0:3>) share a first channel CH0 and a second half of the 8 ways WAY<0:7> (e.g., last four ways WAY<4:7>) share a second channel CH1.

The controller 130 of the memory system 110 in accordance with an embodiment of the present invention uses a scheme of managing the plurality of memory blocks included in the memory device 150, by dividing them in units of super memory blocks.

As exemplified in FIG. 5B, the controller 130 manages each of the super memory blocks SUPER BLOCK<0:1023> by selecting one arbitrary memory block in each of 32 planes PLANE<0:3>*8 included in the memory device 150. Therefore, 32 memory blocks are included in each of the super memory blocks SUPER BLOCK<0:1023>.

Figure 6:
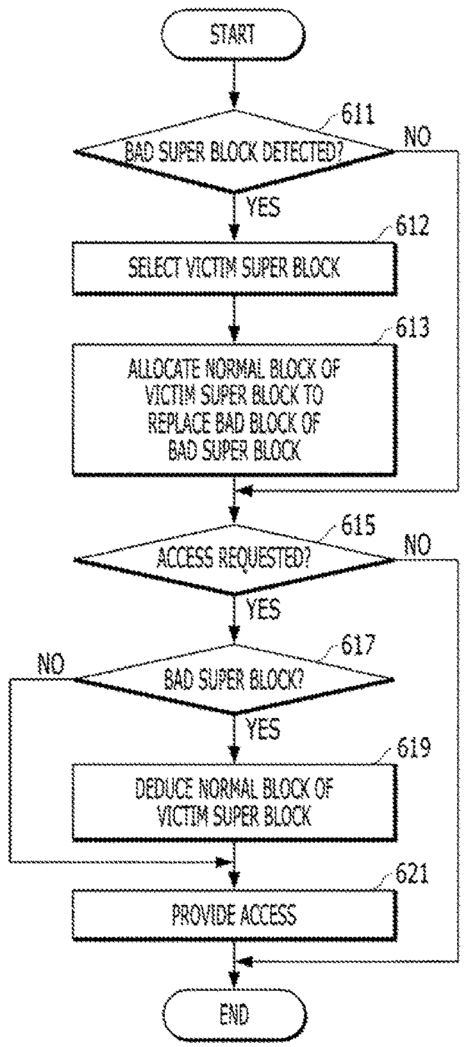
FIG. 6 is a flow chart illustrating a method for operating a memory system in accordance with an embodiment.

Since the controller 130 selects simultaneously the 32 memory blocks included in each of the super memory blocks SUPER BLOCK<0:1023>, in a configuration in which management is performed in units of super memory blocks as in FIG. 6, only super memory block addresses are used for selecting the respective super memory blocks SUPER BLOCK<0:1023>.

In other words, in a configuration in which management is performed in units of super memory blocks, instead of using memory block addresses (not shown) for selecting the respective 32,768 memory blocks BLOCK<0:1023>*32 included in the memory device 150, only super memory block addresses (not shown) are used for selecting the respective 1,024 super memory blocks SUPER BLOCK<0:1023>.

In this manner, in order to use only the super memory block addresses, the controller 130 uses a scheme of managing super memory blocks by grouping memory blocks of the same locations in the respective 32 planes PLANE<0:3>*8 included in the memory device 150.

For example, the controller 130 manages a zeroth super memory block SUPER BLOCK0 by grouping 32 zeroth memory blocks BLOCK0 in the respective 32 planes PLANE<0:3>*8 included in the memory device 150, manages a first super memory block SUPER BLOCK1 by grouping 32 first memory blocks BLOCK1 in the respective 32 planes PLANE<0:3>*8, and manages a second super memory block SUPER BLOCK2 by grouping 32 second memory blocks BLOCK2 in the respective 32 planes PLANE<0:3>*8. In this manner, the controller 130 manages the 32,768 memory blocks BLOCK<0:1023>*32 included in the memory device 150, by dividing them into a total of 1,024 super memory blocks SUPER BLOCK<0:1023>.

Meanwhile, it is substantially impossible for all the memory blocks included in the memory device 150, to operate normally. Namely, it is the norm that bad memory blocks which do not operate normally exist to some extent among the plurality of memory blocks included in the memory device 150. For example, in the embodiment of FIG. 5B, where it is illustrated that 32,768 memory blocks BLOCK<0:1023>*32 are included in the memory device 150, about 650 memory blocks corresponding to approximately 2% may be bad memory blocks.

In this regard, as described above, in the case where the controller 130 uses the scheme of managing super memory blocks by grouping memory blocks of the same locations in the respective 32 planes PLANE<0:3>*8 included in the memory device 150 in order to use only super memory block addresses, a bad super memory block, in which a bad memory block is included among the super memory blocks SUPER BLOCK<0:1023>, may not operate normally. That is to say, if even one memory block among the 32 memory blocks included in each of the super memory blocks SUPER BLOCK<0:1023> is determined as a bad memory block, a corresponding bad super memory block may not operate normally.

In this manner, even though only one memory block is a bad memory block and all the remaining 31 memory blocks are normal among the 32 memory blocks included in a super memory block, then the super memory block is a bad super memory block and cannot be used, which is markedly inefficient.

In consideration of this fact, in the memory system 110 in accordance with an embodiment of the present invention, a bad super memory block where at least one bad memory block is included is reused through methods of operating the memory system 110, which is to be described below with reference to FIGS. 6 to 12.

FIG. 6 is a flow chart illustrating a method of operating the memory system 110 in accordance with an embodiment.

Referring to FIG. 6, the controller 130 may detect at least one bad block in the memory device 150 at step 611.

In detail, among a plurality of super memory blocks, the controller 130 may detect a super memory block in which at least one bad block is included as a bad super memory block. Also, the controller 130 may select at least one victim super memory block among a plurality of the bad super memory blocks at step 612. For example, based on a number of bad blocks included in the respective bad super memory blocks, the controller 130 may select a bad super memory block having smallest number of bad blocks as a victim super memory block among the bad super memory blocks. The controller 130 may detect the locations of bad blocks included in the respective bad super memory blocks and store the locations of the bad blocks in a bad block summary table.

At step 613, the controller 130 may allocate the normal blocks included in the victim super memory block in replacement of the bad blocks included in the remaining bad super memory blocks.

The controller 130 may manage mapping information representing mapping physical-location-relationship between the respective normal blocks of the victim super memory block and the respective bad blocks of the remaining bad super memory blocks. That is to say, the controller 130 may respectively map the normal blocks of the victim super memory block to the bad blocks of the remaining bad super memory blocks. The controller 130 may store the mapping information in a bad group table. The bad group table may include one or more entries respectively corresponding to a plurality of the victim super memory blocks. For example, when assuming that a maximum of 20 super memory blocks are selected as victim super memory blocks, the bad group table may have 20 entries.

Figure 7:
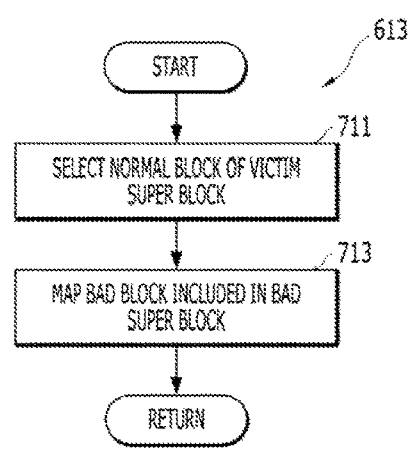
FIG. 7 is a flow chart illustrating an operation of allocating a normal block of a victim super memory block in accordance with an embodiment.
Figure 8A:
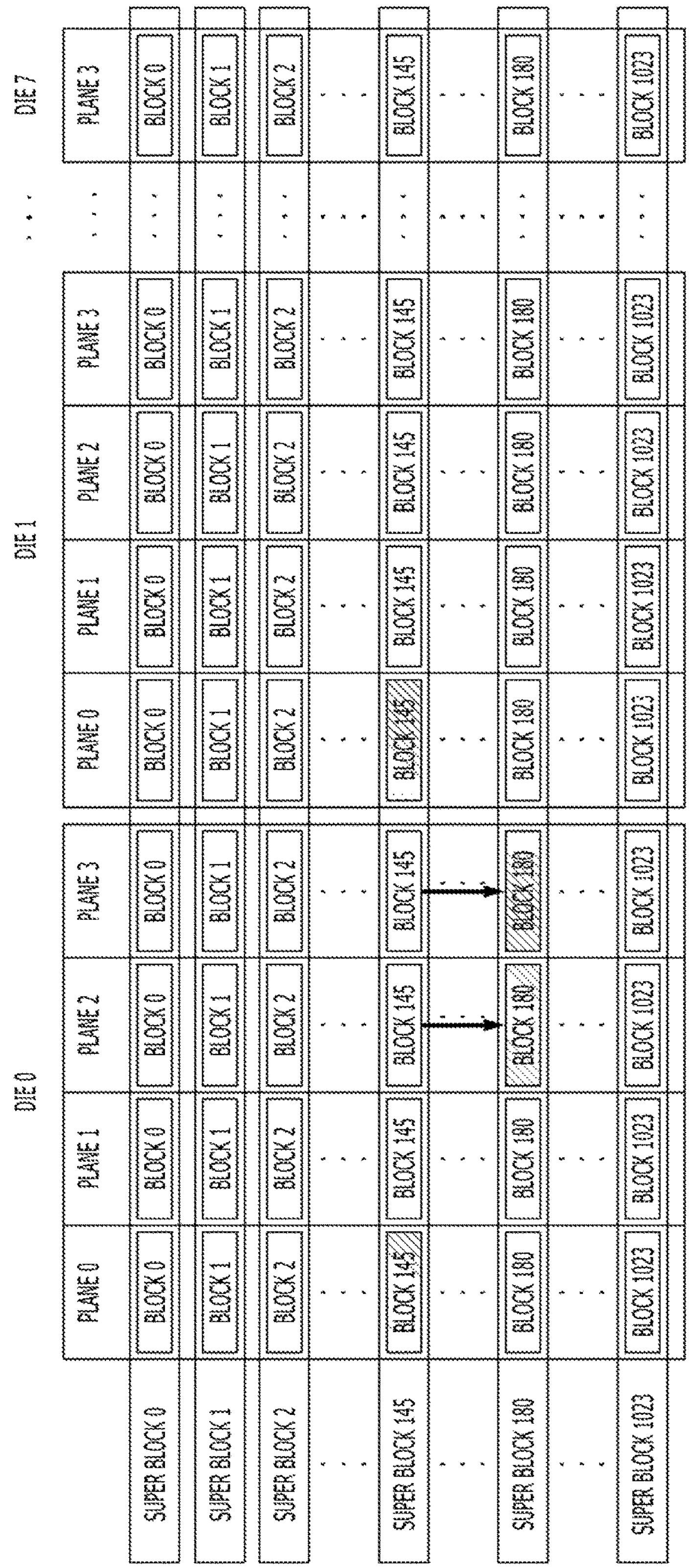

FIG. 7 is a flow chart illustrating an operation at step 613 in accordance with an embodiment. FIGS. 8A and 8B are diagrams illustrating the operation at step 613 in accordance with an embodiment.

Referring to FIGS. 7 and 8A, at step 711, the controller 130 may select normal blocks of the victim super memory block for the bad blocks of the bad super memory block. The selected normal blocks may have the same physical locations as the bad blocks of the bad super memory block. The physical location may be of a plane level.

For example, a super memory block 145 ('SUPER BLOCK 145') may be selected as a victim super memory block. It is assumed that the victim super memory block 145 ('SUPER BLOCK 145') includes bad blocks 145 of plane 0 in die 0 and plane 0 in die 1. For example, a super memory block 180 ('SUPER BLOCK 180') may be a bad super memory block. It is assumed that the bad super memory block 180 ('SUPER BLOCK 180') includes bad blocks 180 of planes 2 and 3 of die 0.

At step 711, the controller 130 may select normal blocks 145 of planes 2 and 3 of die 0 of the victim super memory block 145 ('SUPER BLOCK 145'), which are the same physical location of the bad blocks 180 of the bad super memory block 180 ('SUPER BLOCK 180'), for the bad blocks 180 of the bad super memory block 180 ('SUPER BLOCK 180').

At step 713, the controller 130 may map the selected normal blocks of the victim super memory block to the bad blocks of the bad super memory block.

The physical location information of the memory blocks of the victim super memory blocks and the mapping information between the victim super memory blocks and the remaining bad super memory blocks may be included in the bad group table shown in FIG. 8B. Referring to FIG. 8B, the bad group table may include one or more entries respectively representing the victim super memory blocks. FIG. 8B exemplifies a plurality of entries respectively representing victim super memory blocks 145, 504, 607, and so forth. For each entry, the bad group table may include a plurality of location fields respectively representing physical locations of memory blocks of the victim super memory block represented by the entry. The physical locations of the memory blocks may be of the plane level as exemplified in FIG. 8B.

The controller 130 may mark the bad blocks of the victim super memory block with a predetermined value in the bad group table at step 711. FIG. 8B exemplifies the bad blocks, which are located in plane 0 of die 0 and plane 0 of die 1, of the victim super memory block 145 marked with a value of "FFFF" in the bad group table.

Also, the controller 130 may map the selected normal blocks of the victim super memory block to the bad blocks of the bad super memory block at step 713. The selected normal blocks and the bad blocks may have the same physical locations. As exemplified in FIG. 8B, the controller 130 may select normal blocks, which are located in the planes 2 and 3 of die 0 in the victim super memory block 145, for bad blocks of the same physical location in bad super memory block 180. FIG. 8B exemplifies the location fields representing the selected normal blocks of the planes 2 and 3 of die 0 in the victim super memory block 145, which are marked with the address value "180" representing the bad super memory block 180 in the bad group table. In other words, the bad group table may be configured by one or more rows and a plurality of columns. A plurality of victim super memory blocks may correspond to a plurality of rows, respectively, and the memory blocks included in each victim super memory block may correspond to the plurality of columns, respectively. For example, the controller 130 may add super block addresses to map the normal blocks, that is, 'DIE 0, PLANE 2' and 'DIE 0, PLANE 3,' included in the victim super memory block, that is, 'SUPER BLOCK 145,' to the bad super memory block, that is, 'SUPER BLOCK 180,' in the bad group table. In detail, as shown in the drawing, after storing a super block address indicating 'SUPER BLOCK 145' in the first row of the bad group table, a super block address indicating 'SUPER BLOCK 180' is stored in each of a column corresponding to 'DIE 0, PLANE 2' and a column corresponding to 'DIE 0, PLANE 3' among a plurality of columns corresponding to the first row. While a value of 'FFFF' is stored in each of a column corresponding to 'DIE 0, PLANE 0' and a column corresponding to 'DIE 1, PLANE 0' among the plurality of columns corresponding to the first row of the bad group table, this is to represent that 'DIE 0, PLANE 0' and 'DIE 1, PLANE 0' of 'SUPER BLOCK 145' corresponding to the first row of the bad group table are bad blocks.

While not shown in detail in FIG. 8A, storage of a super block address indicating 'SUPER BLOCK 166' in a column corresponding to 'DIE 0, PLANE 1' among the plurality of columns corresponding to the first row of the bad group table means that 'DIE 0, PLANE 1' of 'SUPER BLOCK 166' is a bad block and 'DIE 0, PLANE 1' of 'SUPER BLOCK 145' as a normal block is used by being mapped to replace the bad block. Similarly, storage of a super block address indicating 'SUPER BLOCK 501' in a column corresponding to 'DIE 7, PLANE 3' among the plurality of columns corresponding to the first row of the bad group table means that 'DIE 7, PLANE 3' of 'SUPER BLOCK 501' is a bad block and 'DIE 7, PLANE 3' of 'SUPER BLOCK 145' as a normal block is used by being mapped to replace the bad block. Moreover, storage of a super block address indicating 'SUPER BLOCK 463' in a column corresponding to 'DIE 7, PLANE 3' among a plurality of columns corresponding to the second row of the bad group table means that 'DIE 7, PLANE 3' of 'SUPER BLOCK 463' is a bad block and 'DIE 7, PLANE 3' of 'SUPER BLOCK 504' as a normal block is used by being mapped to replace the bad block.

Figure 9:
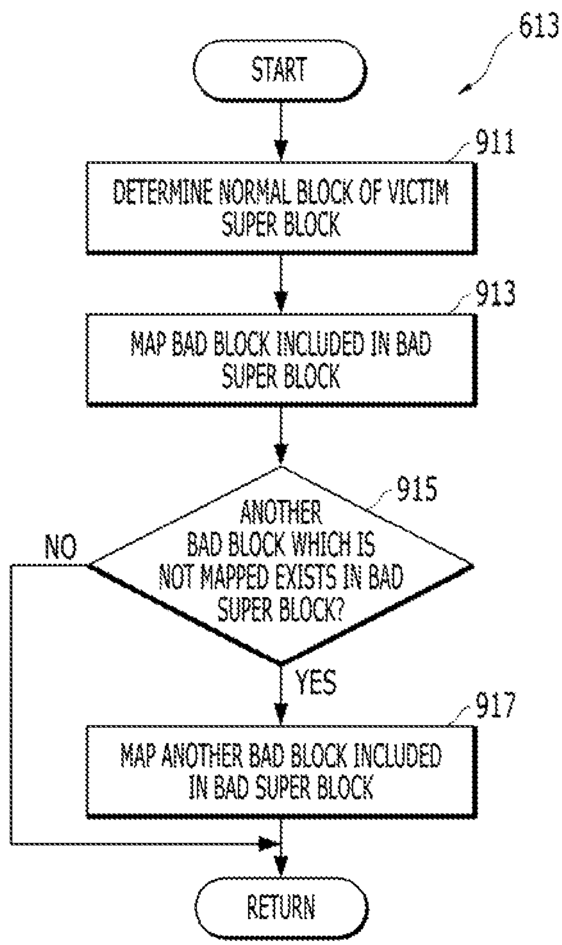
FIG. 9 is a flow chart illustrating an operation of allocating a normal block of a victim super memory block in accordance with an embodiment.
Figure 10A:
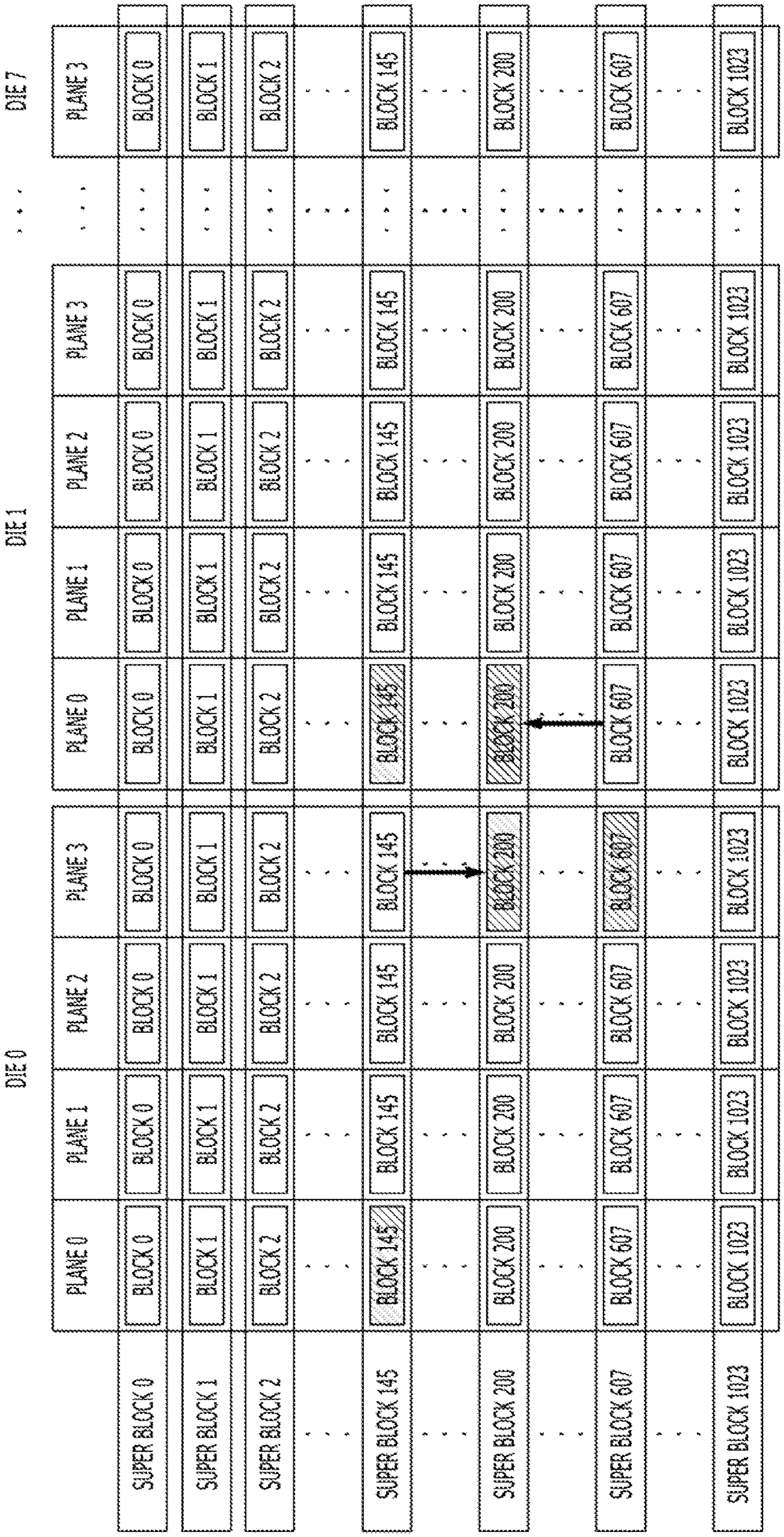

FIG. 9 is a flow chart illustrating an operation of at step 613 in accordance with another embodiment. FIGS. 10A and 10B are diagrams illustrating the operation at step 613 in accordance with an embodiment.

Referring to FIG. 9, steps 911 and 913 may be the same as steps 711 and 713 described with reference to FIGS. 7, 8A and 8B.

For example, super memory blocks 145 and 607 (respectively 'SUPER BLOCK 145' and 'SUPER BLOCK 607') may be selected as victim super memory blocks. It is assumed that the victim super memory block 145 ('SUPER BLOCK 145') includes bad block 145 of plane 0 in a die 0 and plane 0 in a die 1. It is also assumed that the victim super memory block 607 ('SUPER BLOCK 607') includes bad block 607 of plane 3 in die 0. It is further assumed that the bad super memory block 200 ('SUPER BLOCK 200') includes bad blocks 200 of plane 3 of die 0 and plane 0 of die 1. Therefore, by using only the normal blocks included in 'SUPER BLOCK 145,' it is impossible to replace all the bad blocks of 'SUPER BLOCK 200,' and similarly, by using only the normal blocks included in 'SUPER BLOCK 607,' it is impossible to replace all the bad blocks of 'SUPER BLOCK 200.' In this case, the controller 130 may select normal blocks from two or more victim super memory blocks for bad blocks of the single bad super memory block. For example, at steps 911 and 913, the controller 130 may select and map normal block 145 of plane 3 of die 0 of the victim super memory block 145 ('SUPER BLOCK 145'), which are the same physical location of the bad block 200 of the bad super memory block 200 ('SUPER BLOCK 200'), to the bad block 200 of the bad super memory block 200 ('SUPER BLOCK 200').

FIG. 10B exemplifies a first sub-field of the location field representing the selected normal block 145 of the plane 3 of die 0 in the victim super memory block 145, which are marked with the address value "200" representing the bad super memory block 200 in the bad group table. As described above, for each entry, the bad group table may include a plurality of location fields respectively representing physical locations of memory blocks of the victim super memory block represented by the entry. Differently from the embodiment of the bad group table described with reference to FIG. 8B, each location field representing the selected normal blocks of the victim super memory block may include first and second sub-fields in the bad group table of FIG. 10B. The first sub-field may have the mapping information between the victim super memory blocks and the remaining bad super memory blocks, which is the same as the embodiment of the bad group table described with reference to FIG. 8B. The second sub-field will be described later.

At step 915, the controller 130 may determine whether the bad super memory block still have one or more bad blocks which is not mapped to a first victim super memory block (e.g., the victim super memory block 145) even after all the available normal blocks of the first victim super memory block are mapped to the bad blocks of the bad super memory block at step 913. As exemplified in FIG. 10A, the bad block 200 of plane 0 of die 1 in the bad super memory block 200 cannot be mapped to the available normal blocks 145 of the victim super memory block 145 since block 145 of plane 0 of die 1 in the victim super memory block 145 is a bad block. In this case, the controller 130 may determine the bad super memory block 200 to still have bad block 200 of plane 0 of die 1 which is not mapped to the first victim super memory block 145 even after all the available normal blocks 145 of the first victim super memory block 145 are mapped to the bad blocks of the bad super memory block at step 913.

In the case where the controller 130 determines at step 915 the bad super memory block to still have one or more bad blocks not mapped to the first victim super memory block (YES), at step 917, the controller 130 may map a selected normal block of a second victim super memory block, for example, may map the selected normal block 607 of plane 0 of die 1 of the victim super memory block 607 ('SUPER BLOCK 607'), which is at the same physical location of the remaining bad block 200 of the bad super memory block 200 ('SUPER BLOCK 200'), to the remaining bad block 200 of the bad super memory block 200 ('SUPER BLOCK 200').

FIG. 10B exemplifies the first sub-field of the location field representing the selected normal block 607 of the plane 0 of die 1 in the second victim super memory block 607 marked with the address value "200" representing the bad super memory block 200 in the bad group table.

As described above, each location field representing the selected normal blocks of the victim super memory block may include first and second sub-fields in the bad group table of FIG. 10B. The second sub-field may have pointer information indicating another victim super memory block having the selected normal block mapped to the bad blocks of the bad super memory block indicated by the first sub-fields included in the same location field as the second sub-field.

FIG. 10B exemplifies, in the location field representing the selected normal block 145 of plane 3 of die 0 in the first victim super memory block 145, the second sub-field having the pointer information "S3D1P0" indicating the second victim super memory block 607 having the selected normal block 607 of plane 0 of die 1 mapped to the bad block 200 of the bad super memory block 200 indicated by the first sub-fields included in the same location field as the second sub-field (i.e., the location field representing the selected normal block 145 of plane 3 of die 0 in the first victim super memory block 145).

Also, FIG. 10B exemplifies, in the location field representing the second selected normal block 607 of plane 0 of die 1 in the victim super memory block 607, the second sub-field having the pointer information "END" representing that there is no other victim super memory block for bad block in the bad super memory block 200 indicated by the first sub-fields included in the same location field as the second sub-field (i.e., the location field representing the selected normal block 607 of plane 0 of die 1 in the second victim super memory block 607) because all the bad block in the bad super memory block 200 are mapped to the selected normal blocks of the first and second victim super memory blocks 145 an 607. For example, when a bad block 200 of plane 0 of die 1 in a bad super memory block 200 is mapped to a normal block 607 of plane 0 of die 1 represented by a particular location field representing the physical location of plane 0 of die 1 through the first sub-field included therein and the second sub-field included therein has the pointer information "END", the bad block of plane 0 of die 1 may be the last one in the bad super memory block 200.

Further, FIG. 10B exemplifies, in the location field representing the bad block 145 of plane 0 of die 0 in the first victim super memory block 145, the second sub-field having the pointer information "VOID" representing void value because the first sub-fields included in the same location field (i.e., the location field representing the bad block 145 of plane 0 of die 0 in the first victim super memory block 145) has the value "FFFF" representing the bad block 145.

Referring back to FIG. 9, the controller 130 may further set values (e.g., the values of "S3D1P0", "END" and "VOID") of the second sub-fields of a plurality of entries respectively corresponding to a plurality of the victim super memory blocks (e.g., the first and second victim super memory blocks 145 and 607) having the normal blocks mapped to the bad blocks of the single bad super memory block (e.g., the bad super memory block 200) at step 917.

While not shown in detail in FIG. 8A, storage of a super block address indicating 'SUPER BLOCK 166' in a column corresponding to 'DIE 0, PLANE 1' among the plurality of columns corresponding to the first row of the bad group table means that 'DIE 0, PLANE 1' of 'SUPER BLOCK 166' is a bad block and 'DIE 0, PLANE 1' of 'SUPER BLOCK 145' as a normal block is used by being mapped to replace the bad block. Similarly, storage of a super block address indicating 'SUPER BLOCK 501' in a column corresponding to 'DIE 7, PLANE 3' among the plurality of columns corresponding to the first row of the bad group table means that 'DIE 7, PLANE 3' of 'SUPER BLOCK 501' is a bad block and 'DIE 7, PLANE 3' of 'SUPER BLOCK 145' as a normal block is used by being mapped to replace the bad block. Moreover, storage of a super block address indicating 'SUPER BLOCK 463' in a column corresponding to 'DIE 7, PLANE 3' among a plurality of columns corresponding to the second row of the bad group table means that 'DIE 7, PLANE 3' of 'SUPER BLOCK 463' is a bad block and 'DIE 7, PLANE 3' of 'SUPER BLOCK 504' as a normal block is used by being mapped to replace the bad block.

The controller 130 may map the normal block included in the victim super memory block, to the bad block included in the bad super memory block, by using the bad group table as shown in FIG. 8B. That is to say, as described above with reference to FIG. 8B, by using two rows in the bad group table, it is possible to cause the normal blocks included in the first and second victim super memory blocks to replace the bad blocks included in one bad super memory block. However, if the operation method as shown in FIG. 8B is used, when accessing the back super block, it is necessary to search two rows which are separated from each other, in the bad group table, and thus, a lengthy period may be required for searching.

Therefore, in an embodiment of the present disclosure, by generating a bad group table according to the scheme as shown in FIG. 10B, quick searching may become possible even when searching at least two rows which are separated from each other.

In detail, referring to FIG. 10B, the bad group table is configured by a plurality of rows and a plurality of columns, and each of the plurality of columns may include two regions, that is, a first region and a second region. A plurality of victim super memory blocks may correspond to the plurality of rows, respectively, memory blocks included in the victim super memory blocks may correspond to the respective first regions of the plurality of columns, and coupling information is stored in the respective second regions of the plurality of columns. The coupling information is information for allowing a corresponding column to find and be coupled to not a victim super memory block of a corresponding row but another victim super memory block. For example, the controller 130 may add a super block address to the first region of a normal block, that is, 'DIE 0, PLANE 3,' included in the first victim super memory block, that is, 'SUPER BLOCK 145,' to map the normal block, that is, 'DIE 0, PLANE 3,' to the bad super memory block, that is, 'SUPER BLOCK 200,' in the bad group table. Also, the controller 130 may add a super block address to the first region of a normal block, that is, 'DIE 1, PLANE 0,' included in the second victim super memory block, that is, 'SUPER BLOCK 607,' to map the normal block, that is, 'DIE 1, PLANE 0,' to the bad super memory block, that is, 'SUPER BLOCK 200,' in the bad group table.

In detail, as shown in the drawing, after storing a super block address indicating 'SUPER BLOCK 145' in the first row of the bad group table, a super block address indicating 'SUPER BLOCK 200' is stored in the first region of a column corresponding to 'DIE 0, PLANE 3' among the plurality of columns corresponding to the first row. Similarly, after storing a super block address indicating 'SUPER BLOCK 607' in the third row of the bad group table, a super block address indicating 'SUPER BLOCK 200' is stored in the first region of a column corresponding to 'DIE 1, PLANE 0' among the plurality of columns corresponding to the third row. Then, information 3SD0P1 for finding the column corresponding to 'DIE 1, PLANE 0' among the plurality of columns corresponding to the third row of the bad group table is stored in the second region of the column corresponding to 'DIE 0, PLANE 3' among the plurality of columns corresponding to the first row of the bad group table. Through this, in order to access 'SUPER BLOCK 200,' after confirming, by searching the respective first regions of the plurality of columns corresponding to the first row of the bad group table, that a normal block for replacing the bad block positioned in 'DIE 0, PLANE 3' of 'SUPER BLOCK 200' is included in 'SUPER BLOCK 145,' it is possible to immediately find the first region of the column corresponding to 'DIE 1, PLANE 0' of the third row, through the second region of the column corresponding to 'DIE 0, PLANE 3' of 'SUPER BLOCK 145.' Since the third row corresponds to 'SUPER BLOCK 607,' it may be confirmed that a normal block for replacing the bad block positioned in 'DIE 1, PLANE 0' of 'SUPER BLOCK 200' is included in 'SUPER BLOCK 607.' In other words, after searching the first row of the bad group table, without searching entire columns corresponding a second row and columns corresponding to 'DIE 0' of the third row, it is possible to immediately go to the column corresponding to 'DIE 1, PLANE 0' of the third row, check the first region of the column and confirm that a normal block for replacement is included in 'SUPER BLOCK 607.' A value of 'FFFF' is stored in the second region of the column corresponding to 'DIE 1, PLANE 0' of the third row of the bad group table, and this represents that 'DIE 1, PLANE 0' is the last bad block included in 'SUPER BLOCK 200' as a bad super memory block. Namely, the value of 'FFFF' stored in the second region of each of all the columns of the bad group table means that a bad block does not exist anymore in a bad super memory block indicated by a super block address stored in the first region of a corresponding column. For example, the value of 'FFFF' stored in the second region of a column corresponding to 'DIE 0, PLANE 1' among the plurality of columns corresponding to the first row of the bad group table means that a bad block does not exist anymore after a bad block positioned in 'DIE 0, PLANE 1,' in 'SUPER BLOCK 180' indicated by the super block address stored in the first region of the column corresponding to 'DIE 0, PLANE 1.'

Further, while the value of 'FFFF' is stored in the first region of each of a column corresponding to 'DIE 0, PLANE 0' and a column corresponding to 'DIE 1, PLANE 0' among the plurality of columns corresponding to the first row of the bad group table, this is to represent that 'DIE 0, PLANE 0' and 'DIE 1, PLANE 0' of 'SUPER BLOCK 145' corresponding to the first row of the bad group table are bad blocks. If the value of 'FFFF' is stored in the first region of a corresponding column in this way, any value may be stored in the second region of the corresponding column. In this regard, it is exemplified in the drawing that a corresponding column is kept empty or is stored with the value of 'FFFF.'

Referring back to FIG. 6, when the controller 130 detects an access request from the host 102 to a super memory block in the memory device 150 at step 615. When an access request to the memory device 150 is received from the host 102, the controller 130 may detect the access request. When the controller 130 tries to access any one among the plurality of super memory blocks included in the memory device 150, according to the access request, a corresponding super memory block may be a bad super memory block. The controller 130 may determine whether the access-requested super memory block is a bad super memory block based on the bad block summary table at step 617. The bad block summary table is generated at step 611. When the controller 130 determines that the access-requested super memory block is a bad super memory block at step 617, the controller 130 may find from the bad group table, which is generated at step 613, the normal blocks mapped to bad blocks included in the access-requested super memory block at step 619. At step 621, the controller 130 may provide an access to the normal blocks of the access-requested super memory block and the victim super memory blocks.

In an embodiment, at step 619 of finding the normal blocks mapped to the bad blocks of the access-requested super memory block from the bad group table, the controller 130 may sequentially scan the location fields on entry-by-entry basis in the bad group table described with reference to FIG. 8B in order to find the address value of the access-requested bad super memory block. When the address value of the access-requested bad super memory block is found, the controller 130 may replace the bad block of the physical location represented by the location field having the address value with the normal block of the same physical location in the victim super memory block in response to the access request for the bad block of the access-requested bad super memory block. As exemplified in FIG. 8B, the controller 130 may replace bad blocks located in the planes 2 and 3 of die 0 in the access-requested bad super memory block 180 with the normal blocks of the same physical location in the victim super memory block 145.

In an embodiment, at step 619, the controller 130 may sequentially scan the first sub-fields of the location fields on entry-by-entry basis in the bad group table described with reference to FIG. 10B in order to find the address value of the access-requested bad super memory block. When the address value of the access-requested bad super memory block is found in a particular first sub-field of a first victim super memory block, the controller 130 may replace the bad block of the physical location represented by the location field of the first sub-field having the address value with the normal block of the same physical location in the first victim super memory block in response to the access request for the bad block of the access-requested bad super memory block. As exemplified in FIG. 10B, the controller 130 may replace a bad block located in the plane 3 of die 1 in the access-requested bad super memory block 200 with the normal blocks of the same physical location in the first victim super memory block 145.

Further, in the embodiment, when the address value of the access-requested bad super memory block is found in a particular first sub-field of the first victim super memory block, the controller 130 may check the pointer information of the second sub-field included in the same location field as the particular first sub-field. When the pointer information of the second sub-field indicates a physical location of a normal block in a second victim super memory block, the controller 130 may replace the bad block of the physical location represented by the location field of the first sub-field having the address value with the normal block of the same physical location in the second victim super memory block in response to the access request for the bad block of the access-requested bad super memory block. As exemplified in FIG. 10B, due to the pointer information "S3D1P0" in the first victim super memory block 145 indicating the second victim super memory block 607 having the normal block 607 of plane 0 of die 1 mapped to the bad block 200 of the bad super memory block 200 indicated by the first sub-fields included in the same location field as the second sub-field (i.e., the location field representing the normal block 145 of plane 3 of die 0 in the first victim super memory block 145), the controller 130 may replace a bad block located in the plane 0 of die 1 in the access-requested bad super memory block 200 with the normal block 607 of the same physical location in the second victim super memory block 607.

Until the controller 130 finds the second sub-field indicating the pointer information "END", the controller 130 may repeat the checking of the pointer information of the second sub-field and the replacing of the bad block with the normal block based on the pointer information such that the current second victim super memory block is regarded as a next first victim super memory block.

When the second sub-field indicates the pointer information "END", the controller 130 may end step 619. As exemplified in FIG. 10B, due to the pointer information "END" in the victim super memory block 607, the controller 130 may end step 619 and proceed to step 621.

As described above, in the embodiment regarding the bad group table of FIG. 10B, the controller 130 may not have to scan all of the location fields on entry-by-entry basis in the bad group table because of the pointer information included in the second sub-field.

Figure 11:
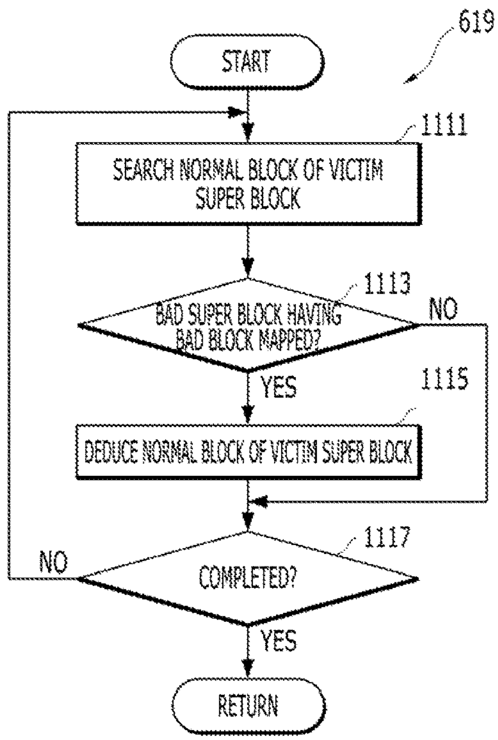
FIG. 11 is a flow chart illustrating an operation of deducing a normal block of a victim super memory block in accordance with an embodiment.

FIG. 11 is a flow chart of an operation of deducing a normal block of a victim super memory block in accordance with an embodiment.

Referring to FIG. 11, it may be seen that, in the case where the bad group table is generated in the scheme described above with reference to FIGS. 7, 8A and 8B, the controller 130 performs an operation of searching the bad group table to deduce a normal block of a victim super memory block for replacing a bad block included in a bad super memory block to which an access request is detected.

In detail, at operations 1111, 1113 and 1117, in order to check where a super block address indicating a bad super memory block to which an access request is detected is stored in the bad group table, the controller 130 may search sequentially the values stored in the bad group table in such a way as to search the plurality of columns included in the first row of the bad group table and then search the plurality of columns included in the second row of the bad group table. While searching, in this way, the values stored in the bad group table sequentially one by one by repeatedly performing the operations 1111, 1113 and 1117, if a super block address indicating a bad super memory block to which an access request is detected is detected, operation 1115 is performed.

Namely, by checking a storage position in the bad group table, searched at the operation 1111, the operation 1113 and operation 1117, the controller 130 may deduce a normal block of a victim super memory block for replacing a bad block included in a bad super memory block to which an access request is detected.

For example, when assuming by referring to FIG. 8B together that a bad super memory block to which an access request is detected is 'SUPER BLOCK 180,' it may be seen that a first bad block is positioned in 'DIE 0, PLANE 2' of 'SUPER BLOCK 180' as the bad super memory block and a second bad block is positioned in 'DIE 0, PLANE 3' of 'SUPER BLOCK 180' as the bad super memory block. In this state, when performing first the operation 1111 and the operation 1113, it is possible to find that a super block address indicating 'SUPER BLOCK 180' is stored in the first row and the third column of the bad group table. That is to say, because 'DIE 0, PLANE 2' where the first bad block of 'SUPER BLOCK 180' is positioned corresponds to the third column of the bad group table, it is possible to find 'DIE 0, PLANE 2,' by searching the first row of the bad group table at the operation 1111 and the operation 1113 performed first. Since the first row of the bad group table stores a super block address indicating 'SUPER BLOCK 145,' it may be seen that a victim super memory block is 'SUPER BLOCK 145.' Therefore, it is possible to determine, through the operation 1115, that a normal block to be mapped in replacement of the first bad block positioned in 'DIE 0, PLANE 2' of 'SUPER BLOCK 180' as the bad super memory block to which an access request is detected is included in 'SUPER BLOCK 145.'

Then, at the operation 1117, it may be checked that a bad block not mapped to a normal block, that is, the second bad block positioned in 'DIE 0, PLANE 3,' still remains in 'SUPER BLOCK 180' as the bad super memory block to which the access request is detected.

Therefore, by performing second the operation 1111 and the operation 1113, it is possible to find that a super block address indicating 'SUPER BLOCK 180' is stored in the first row and the fourth column of the bad group table. That is to say, because 'DIE 0, PLANE 3' where the second bad block of 'SUPER BLOCK 180' is positioned corresponds to the fourth column of the bad group table, it is possible to find 'DIE 0, PLANE 3,' by searching the first row of the bad group table at the operation 1111 and the operation 1113 performed second. Since the first row of the bad group table stores a super block address indicating 'SUPER BLOCK 145,' it may be seen that a victim super memory block is 'SUPER BLOCK 145.' Therefore, it is possible to determine, through the operation 1115, that a normal block to be mapped in replacement of the second bad block positioned in 'DIE 0, PLANE 3' of 'SUPER BLOCK 180' as the bad super memory block to which the access request is detected is included in 'SUPER BLOCK 145.'

In succession, at the operation 1117, it may be checked that a bad block which is not mapped yet to a normal block does not exist anymore in 'SUPER BLOCK 180' as the bad super memory block to which the access request is detected.

Figure 12:
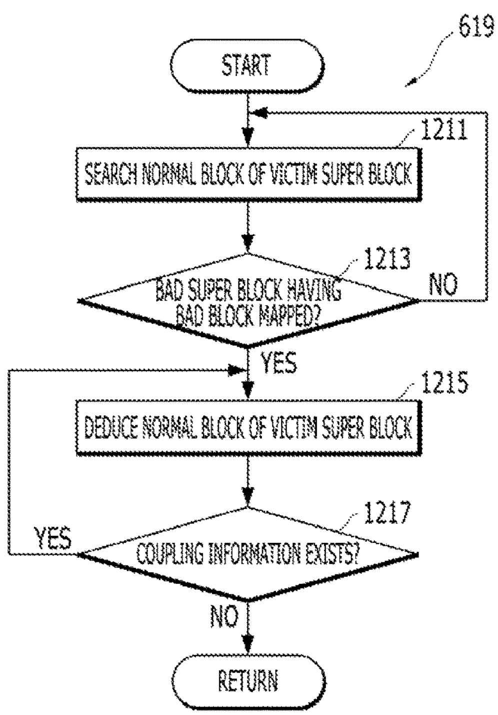
FIG. 12 is a flow chart illustrating an operation of deducing a normal block of a victim super memory block in accordance with another embodiment.

FIG. 12 is a flow chart of an operation of deducing a normal block of a victim super memory block in accordance with another embodiment.

Referring to FIG. 12, it may be seen that, in the case where the bad group table is generated in the scheme described above with reference to FIGS. 9, 10A and 10B, the controller 130 performs an operation of searching the bad group table to deduce a normal block of a victim super memory block for replacing a bad block included in a bad super memory block to which an access request is detected.

In detail, at operations 1211 and 1213, in order to check where a super block address indicating a bad super memory block to which an access request is detected is stored in the bad group table, the controller 130 may search sequentially the values stored in the bad group table in such a way as to search the first regions of the plurality of columns included in the first row of the bad group table and then search the first regions of the plurality of columns included in the second row of the bad group table. While searching, in this way, the values stored in the bad group table sequentially one by one by repeatedly performing the operations 1211 and 1213, if a super block address indicating a bad super memory block to which an access request is detected is detected, operation 1215 is performed. After the operation 1215 is performed, the operation 1211 and the operation 1213 are not performed again, and instead, at operation 1217, it is checked whether coupling information exists in the second region of a column which was a target of the operation 1215.

That is, by checking a storage position in the bad group table, searched in the operation 1211 and the operation 1213, the controller 130 may deduce a normal block of a victim super memory block for replacing a first bad block included in a bad super memory block to which an access request is detected. Then, at the operation 1217, the controller 130 may deduce a normal block of a victim super memory block for replacing at least a second bad block included in the bad super memory block to which the access request is detected.

For example, when assuming by referring to FIG. 10B together that a bad super memory block to which an access request is detected is 'SUPER BLOCK 200,' it may be seen that a first bad block is positioned in 'DIE 0, PLANE 3' of 'SUPER BLOCK 200' as the bad super memory block. In this state, when performing first the operation 1211 and the operation 1213, it is possible to find that a super block address indicating 'SUPER BLOCK 200' is stored in the first row and the first region of the fourth column of the bad group table. That is to say, because 'DIE 0, PLANE 3' where the first bad block of 'SUPER BLOCK 200' is positioned corresponds to the fourth column of the bad group table, it is possible to find 'DIE 0, PLANE 3,' by searching the first row of the bad group table at the operation 1211 and the operation 1213 performed first. Since the first row of the bad group table stores a super block address indicating 'SUPER BLOCK 145,' it may be seen that a victim super memory block is 'SUPER BLOCK 145.' Therefore, it is possible to determine, through the operation 1215, that a normal block to be mapped in replacement of the first bad block positioned in 'DIE 0, PLANE 3' of 'SUPER BLOCK 200' as the bad super memory block to which an access request is detected is included in 'SUPER BLOCK 145.'

Then, at the operation 1217, it is checked that which value is stored in the second region of the fourth column of the first row of the bad group table which was a target of the operation 1215. As a result of the operation 1217, it may be seen that the value of '3SD0P1' is stored and this is a value indicating the third row and the fifth column of the bad group table. Therefore, by checking, through the operation 1215, the first region of the fifth column of the third row of the bad group table, it may be seen that a super block address indicating 'SUPER BLOCK 200' as the bad super memory block is stored. Since the third row of the bad group table stores a super block address indicating 'SUPER BLOCK 607,' it may be seen that a victim super memory block is 'SUPER BLOCK 607.' Therefore, it is possible to determine, through the operation 1217, that the second bad block of 'SUPER BLOCK 200' as the bad super memory block to which the access request is detected is positioned in 'DIE 1, PLANE 0' and a normal block to be mapped in replacement of the second bad block is included in 'SUPER BLOCK 607.'

Then, at the operation 1217, it is checked that which value is stored in the second region of the fifth column of the third row of the bad group table which was a target of the operation 1215. As a result of the operation 1217, it may be checked that the value of 'FFFF' is stored and, through this, a bad block which is not mapped yet to a normal block does not exist anymore in 'SUPER BLOCK 200' as the bad super memory block to which the access request is detected.

Referring again to FIG. 6, at operation 621, the controller 130 may provide an access to the bad super memory block of the memory device 150 which is access-requested through the operation 611.

Hereinbelow, detailed descriptions will be made with reference to FIGS. 13 to 18, for a data processing system and electronic appliances to which the memory system 110 including the memory device 150 and the controller 130 described above with reference to FIGS. 1 to 12, according to the embodiment, is applied.

Figure 13:
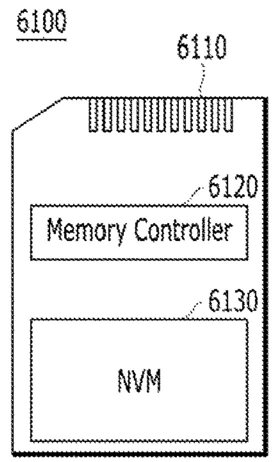
FIGS. 13 to 18 are diagrams schematically illustrating application examples of the data processing system of FIG. 1 in accordance with various embodiments of the present invention.

FIG. 13 is a diagram illustrating a data processing system including the memory system according to the embodiment. FIG. 13 is a drawing schematically illustrating a memory card system to which the memory system according to an embodiment is applied.

Referring to FIG. 13, a memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, For example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 14:
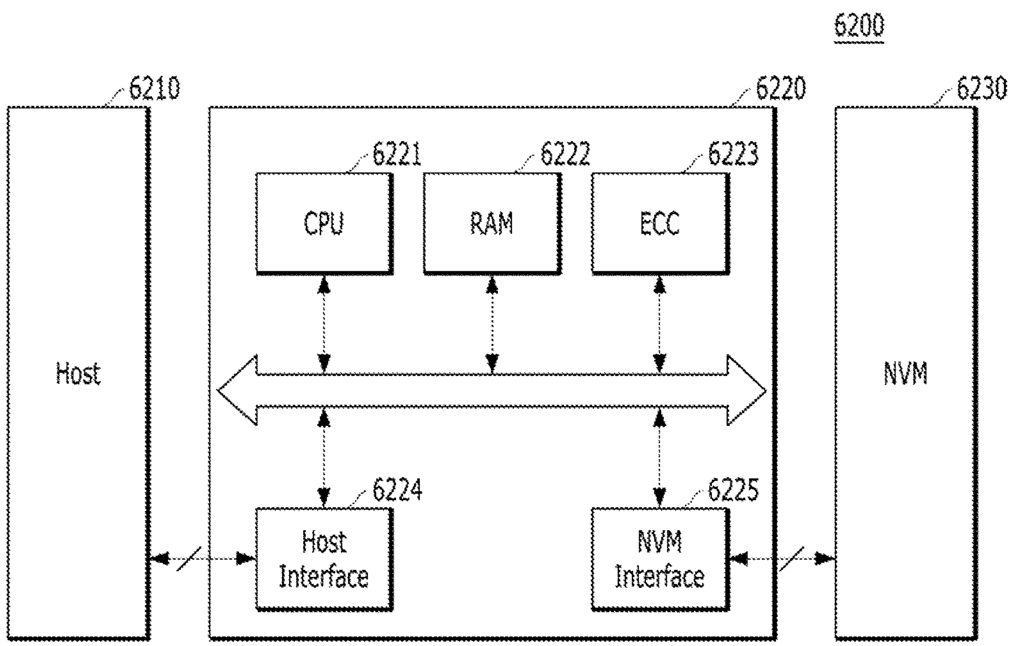

FIG. 14 is a diagram schematically illustrating an example of a data processing system including a memory system according to an embodiment of the present invention.

Referring to FIG. 14, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 15:
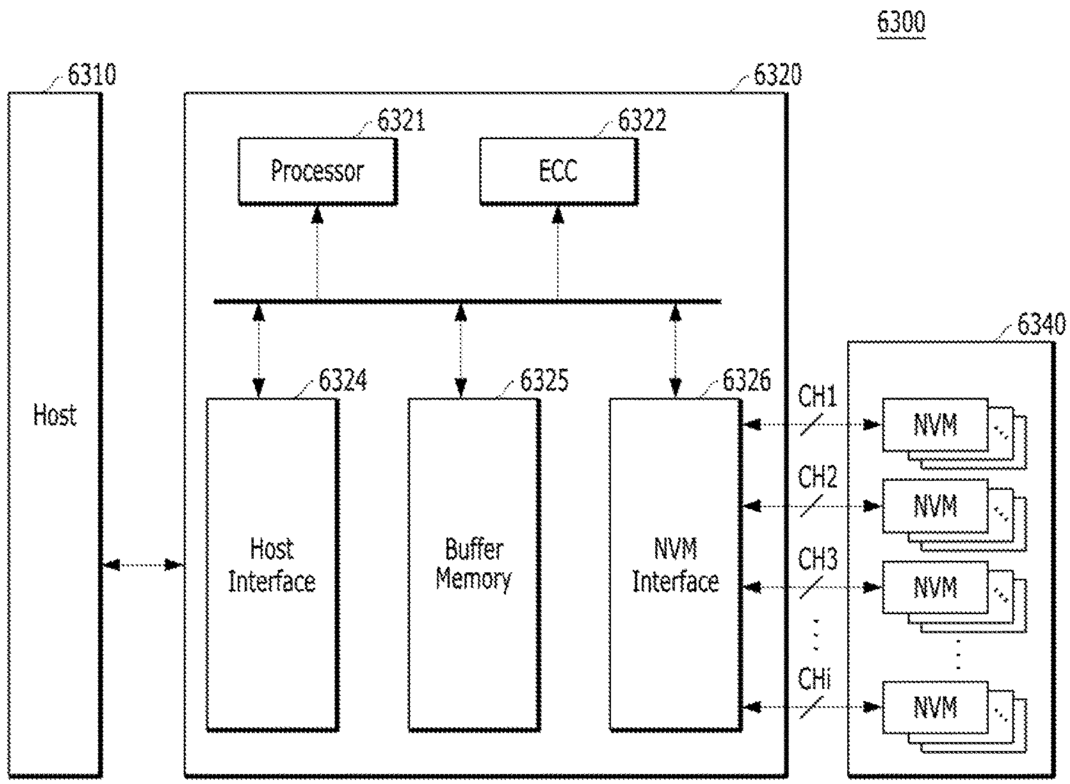

FIG. 15 is a diagram illustrating an example of a data processing system including a memory system according to an embodiment of the invention. FIG. 15 may be a solid state drive (SSD).

Referring to FIG. 15, an SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . , and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 15, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 16:
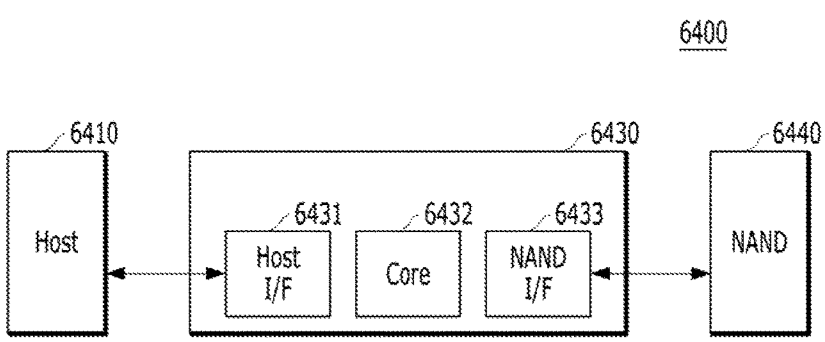

FIG. 16 is a diagram illustrating another example of a data processing system including the memory system according to an embodiment of the present invention. FIG. 16 is a drawing schematically illustrating an embedded multimedia card (eMMC) to which a memory system according to an embodiment is applied.

Referring to FIG. 16, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 17:
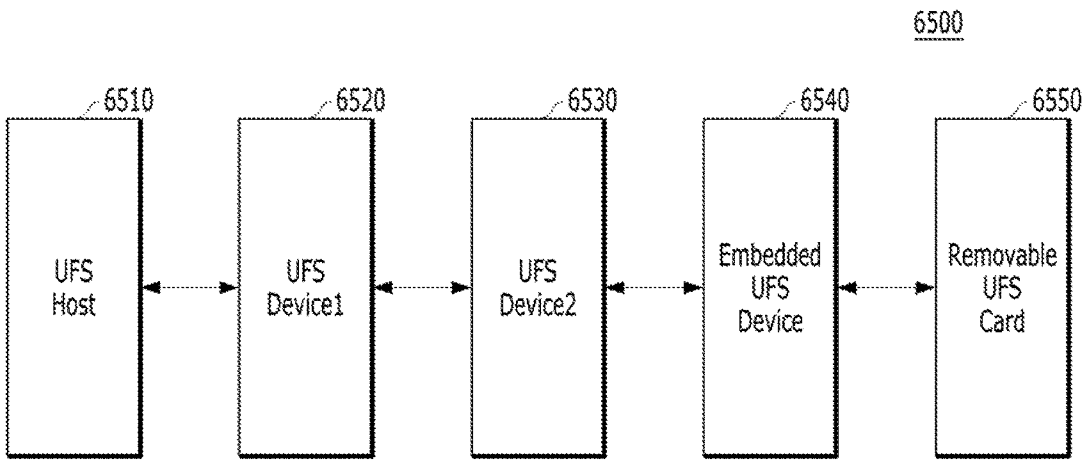

FIG. 17 is a diagram illustrating another example of a data processing system including a memory system according to an embodiment of the present invention. FIG. 16 is a drawing schematically illustrating a universal flash storage (UFS) to which the memory system according to the embodiment is applied.

Referring to FIG. 17, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 13. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 18:
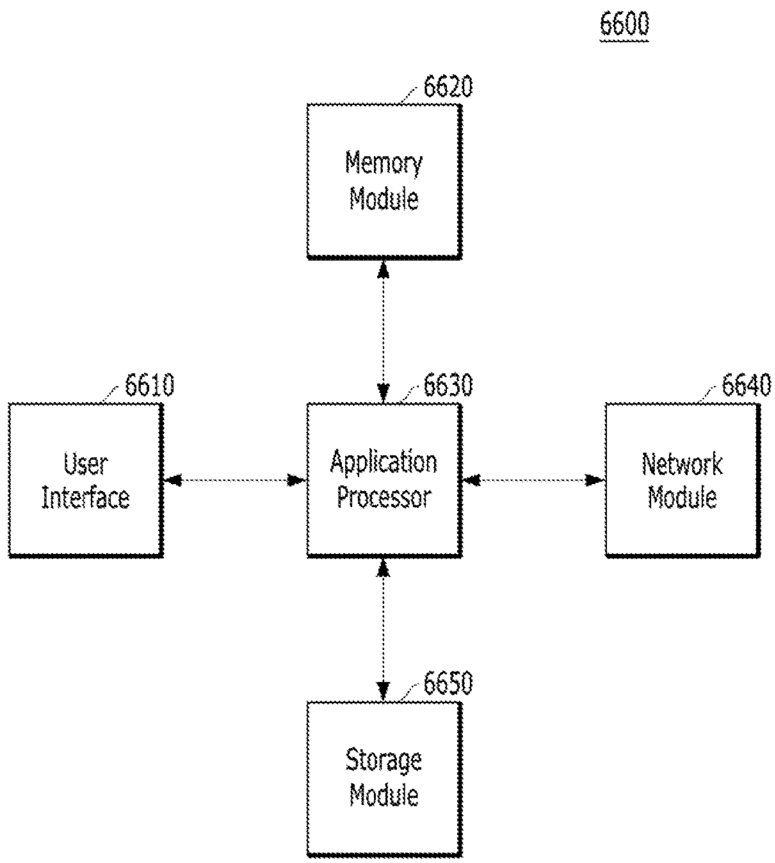

FIG. 18 is a diagram illustrating an example of a data processing system including the memory system according to an embodiment of the present invention. FIG. 18 is a drawing schematically illustrating a user system to which the memory system according to the embodiment is applied.

Referring to FIG. 18, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 15 to 17.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

According to various embodiments, a memory system may manage a plurality of blocks by grouping them into a plurality of super memory blocks, and use at least any one of the super memory blocks as a victim super memory block. That is to say, the memory system may swap normal blocks of the victim super memory block with bad blocks of remaining super memory blocks. In correspondence to the victim super memory block, the memory system may store mapping information according to the swap of the normal blocks of the victim super memory block with the bad blocks of the remaining super memory blocks. Therefore, the amount of mapping information in the memory system may be minimized, and a storage space for storing the mapping information may be reduced.

Although various embodiments have been described for illustrative purposes, it will be apparent to those skilled in the art that various changes and modifications may be made without departing from the spirit and scope of the invention as defined in the following claims.

What is claimed is:

1. A memory system comprising:

a memory device including a plurality of memory blocks constituting with a plurality of super memory blocks, wherein each super memory block includes some memory blocks among the plurality of memory blocks; and a controller suitable for detecting two or more bad super memory blocks each including at least one bad block and at least one normal block, among the super memory blocks, selecting at least one victim super memory block among the two or more bad super memory blocks, and replacing the at least one bad block of each remaining bad super memory blocks with the at least one normal block of the at least one victim super memory block.

2. The memory system of claim 1, wherein the controller generates a bad group table indicating a mapping relationship between the at least one bad block of each of the remaining bad super memory blocks and the at least one normal blocks of the at least one victim super memory block which replace the at least one bad block of each of the remaining bad super memory blocks.

3. The memory system according to claim 2, wherein, in response to a request of access to at least one of the two or more bad super memory blocks, the controller provides access to the at least one normal blocks replacing the at least one bad blocks in the access-requested bad super memory blocks according to the mapping relationship.

4. The memory system according to claim 3, wherein the controller replaces the at least one bad block of each of the remaining bad super blocks with the at least one normal blocks of the at least one victim super block, having the same physical locations as the at least one bad block of each of the remaining bad super blocks, and wherein the physical location is of a plane level in the memory device.

5. The memory system according to claim 4, wherein the bad group table includes at least one entry respectively representing the at least one victim super memory block, wherein, for the at least one entry, the bad group table includes a plurality of location fields respectively representing physical locations of memory blocks of a corresponding victim super memory block, and wherein each location field representing the normal block in the at least one victim super memory block has an address value of the remaining bad super memory block having the bad block, which is replaced by the normal block represented thereby.

6. The memory system according to claim 4, wherein the bad group table includes at least one row and a plurality of columns configured in the form of a matrix, and wherein, the at least one victim super memory block corresponds to one row, memory blocks included in the at least one victim super memory block correspond to the columns, and the at least one bad blocks included in each of remaining bad super memory blocks are mapped to the columns.

7. The memory system according to claim 5, wherein, in response to the request, the controller provides access to the at least one normal blocks replacing the at least one bad blocks in the access-requested bad super memory blocks by:

searching the address values of the access-requested bad super memory blocks on an entry-by-entry basis in the bad group table; and identifying the at least one normal blocks replacing the access-requested at least one bad blocks through the physical locations of the at least one normal blocks indicated by the location fields having the address values of the access-requested bad super memory blocks.

8. The memory system according to claim 4, wherein the bad group table includes at least one entry representing the at least one victim super memory block, wherein, for the at least one entry, the bad group table includes a plurality of location fields respectively representing physical locations of memory blocks of the at least one victim super memory block and each location field including first and second sub-fields, wherein the first sub-field, a corresponding location field of which represents the normal block in the at least one victim super memory block, has an address value of the remaining bad super memory block having the bad block, which is replaced by the normal block represented by the corresponding location field, and wherein the second sub-field of the corresponding location field has a pointer information indicating another normal block in another victim super memory block replacing another bad block in the remaining bad super memory block represented by the corresponding location field.

9. The memory system according to claim 8, wherein, in response to a request of access to at least one of the bad super memory blocks, the controller provides the at least one normal blocks replacing the at least one bad blocks in the access-requested bad super memory blocks by:

searching the address value of the access-requested bad super memory block on an entry-by-entry basis in the bad group table;

identifying a first normal block replacing a first one of the at least one bad blocks in the respective access-requested bad super memory blocks through the physical location of the first normal block indicated by the location field having the address value of the respective access-requested bad super memory blocks in the first sub-field thereof; and identifying respective second and following normal blocks replacing respective second and following ones of the at least one bad blocks in the respective access-requested bad super memory blocks through the physical locations of the respective second and following normal blocks indicated by the location fields corresponding to the respective second and following normal blocks and having the address value of the respective access-requested bad super memory blocks in the first sub-fields of the location fields corresponding to the respective second and following normal blocks via the pointer information in the second sub-fields of the location fields corresponding to the respective first and following normal blocks.

10. A method for operating a memory system which includes a memory device including a plurality of memory blocks constituting with a plurality of super memory blocks, wherein each super memory blocks includes some memory blocks among the plurality of memory blocks, the method comprising:

detecting two or more bad super memory blocks each including at least one bad block and at least one normal block, among the super memory blocks;

selecting at least one victim super memory block among the two or more bad super memory blocks; and replacing the bad blocks of each remaining bad super memory blocks with the at least one normal blocks of the at least one victim super memory block, wherein the replacing includes generating a bad group table indicating a mapping relationship between the at least one bad blocks of the remaining bad super memory blocks and the at least one normal block of the at least one victim super memory block.

11. The method according to claim 10, wherein the replacing includes, in response to a request of access to one or more of the two or more bad super memory blocks, providing access to the at least one normal blocks replacing the at least one bad blocks in the access-requested bad super memory blocks according to the mapping relationship.

12. The method according to claim 11, wherein the at least one bad block of each of the remaining bad super memory blocks are replaced with the at least one normal block of the at least one victim super memory block, having the same physical locations as the at least one bad block of each of the remaining bad super memory blocks, and wherein the physical location is of a plane level in the memory device.

13. The method according to claim 12, wherein the bad group table includes at least one entry respectively representing the at least one victim super memory block, the at least one entry including a plurality of location fields respectively representing physical locations of memory blocks of the at least one victim super memory block, each location field representing the normal block in the at least one victim super memory block having an address value of the remaining bad super memory block having the bad block, which is replaced by the normal block represented thereby.

14. The method according to claim 12, wherein the bad group table includes at least one row and a plurality of columns configured in the form of a matrix, the at least one victim super memory block corresponds to one row, memory blocks included in the at least one victim super memory block correspond to the columns, and the at least one bad blocks included in the remaining bad super memory blocks are mapped to the columns.

15. The method according to claim 13, wherein the providing of access includes:

searching the address values of the access-requested bad super memory blocks on an entry-by-entry basis in the bad group table; and identifying the at least one normal blocks replacing the at least one bad blocks in the access-requested bad super memory blocks through the physical locations of the at least one normal blocks indicated by the location fields having the address values of the access-requested bad super memory blocks.

16. The method according to claim 13, wherein the bad group table includes at least one entry respectively representing the at least one victim super memory block, wherein, for the at least one entry, the bad group table includes a plurality of location fields respectively representing physical locations of memory blocks of the at least one victim super memory block and each including first and second sub-fields, wherein the first sub-field, a corresponding location field of which represents the normal block in the at least one victim super memory block, has an address value of the remaining bad super memory block having the bad block, which is replaced by the normal block represented by the corresponding location field, and wherein the second sub-field of the corresponding location field has a pointer information indicating another normal block in another victim super memory block replacing another bad block in the remaining bad super memory block represented by the corresponding location field.

17. The method according to claim 16, wherein the providing of access includes:

searching the address value of the access-requested bad super memory blocks on an entry-by-entry basis in the bad group table;

identifying a first normal block replacing a first one of the at least one bad blocks in the respective access-requested bad super memory blocks through the physical location of the first normal block indicated by the location field having the address value of the respective access-requested bad super memory blocks in the first sub-field thereof; and identifying respective second and following normal blocks replacing respective second and following ones of the at least one bad blocks in the respective access-requested bad super memory blocks through the physical locations of the respective second and following normal blocks indicated by the location fields corresponding to the respective second and following normal blocks and having the address value of the respective access-requested bad super memory blocks in the first sub-fields of the location fields corresponding to the respective second and following normal blocks via the pointer information in the second sub-fields of the location fields corresponding to the respective first and following normal blocks.

18. A memory system comprising:

a memory device including a plurality of dies, each die comprising a plurality of planes and each plane comprising a plurality of memory blocks;

a controller suitable for arranging the plurality of memory blocks in a plurality of super memory blocks, detecting two or more bad super memory blocks each including at least one bad block and at least one normal block, among the super memory blocks, selecting at least one victim super memory block among the two or more bad super memory blocks, and generating a bad group table indicating a mapping relationship between the at least one bad block of each of the remaining bad super memory blocks and the at least one normal blocks of the at least one victim super memory block for replacing the at least one bad block of each of the remaining bad super memory blocks with the at least one normal blocks of the at least one victim super memory block, wherein the plurality of super memory blocks each include some memory blocks among the plurality of memory blocks.

19. The memory system according to claim 18, wherein, in response to a request of access to one or more of the two or more bad super memory blocks, the controller provides access to the at least one normal blocks replacing the at least one bad blocks in the access-requested bad super memory blocks according to the mapping relationship.

20. The memory system according to claim 19, wherein the controller replaces the at least one bad block of each of the remaining bad super memory blocks with the at least one normal block of the at least one victim super memory block, having the same physical locations as the bad blocks in the bad super memory blocks, and wherein the physical location is of a plane level in the memory device.

* * * * *